(12) United States Patent
Bianchini

(10) Patent No.: US 7,105,988 B2
(45) Date of Patent: Sep. 12, 2006

(54) PIEZOELECTRIC DEVICE AND METHOD TO MANUFACTURE A PIEZOELECTRIC DEVICE

(75) Inventor: Emanuele Bianchini, Winchester, MA (US)

(73) Assignee: Vibration-X di Bianchini Emanulee e C. Sas, San Vito Al Tagliamento (IT)

( * ) Notice: Subject to any disclaimer, the term of this patent is extended or adjusted under 35 U.S.C. 154(b) by 137 days.

(21) Appl. No.: 10/834,683

(22) Filed: Apr. 28, 2004

(65) Prior Publication Data

US 2004/0217674 A1    Nov. 4, 2004

Related U.S. Application Data

(60) Provisional application No. 60/466,664, filed on Apr. 30, 2003.

(51) Int. Cl.
H01L 41/47 (2006.01)
H01L 41/53 (2006.01)

(52) U.S. Cl. .................. 310/340; 310/348; 310/366

(58) Field of Classification Search ............. 310/340, 310/345, 348, 365, 366
See application file for complete search history.

(56) References Cited

U.S. PATENT DOCUMENTS 4,409,510 A * 10/1983 Assenza et al. ............. 310/334
4,642,508 A * 2/1987 Suzuki et al. ............... 310/321
4,904,894 A    2/1990 Henry et al.
5,281,888 A * 1/1994 Takeuchi et al. ............ 310/366
6,392,332 B1* 5/2002 Sung .......................... 310/359
6,778,090 B1* 8/2004 Newham ................. 340/573.1
2002/0084350 A1    7/2002 Kawazoe et al.
2002/0140321 A1   10/2002 Waterfield
2003/0001696 A1*  1/2003 Yoshida et al. ............. 333/193

FOREIGN PATENT DOCUMENTS

| DE | 42 17 351 C1 |   | 10/1993 |
| JP | 61-040071 A  |   | 2/1986  |
| JP | 61-182286    | * | 8/1986  |
| JP | 11-004137    | * | 1/1999  |
| JP | 10-173251    | * | 10/2005 |
| WO | WO 95/20827 A1 |  | 8/1995  |
| WO | WO 01/89004 A1 |  | 11/2001 |

* cited by examiner

Primary Examiner—Thomas M. Dougherty
(74) Attorney, Agent, or Firm—Akin Gump Strauss Hauer & Feld, LLP

(57) ABSTRACT

A piezoelectric device is formed of a supporting substrate with first and second conductive traces on a first surface. A piezoelectric material layer is laminated to the supporting substrate with a first surface of the piezoelectric material layer electrically connected to the second conductive trace and a second surface of the piezoelectric material layer electrically conducted to the first conductive trace. A protective coating is applied over the piezoelectric material layer so that at least a portion of the first and second conductive traces are exposed.

12 Claims, 3 Drawing Sheets

PIEZOELECTRIC DEVICE AND METHOD TO MANUFACTURE A PIEZOELECTRIC DEVICE

CROSS-REFERENCE TO RELATED APPLICATIONS

This application claims the benefit of U.S. Provisional Patent Application Ser. No. 60/466,664 filed Apr. 30, 2003 and entitled "Manufacturing Method and Construction of Piezoelectric Device" the complete subject matter of which is hereby incorporated herein by reference.

BACKGROUND OF THE INVENTION

The present invention relates to piezoelectric devices and, more particularly, to a piezoelectric device which is well suited for interconnecting with other components and which is well insulated. Piezoelectric materials are materials capable of converting electrical energy into mechanical energy and vice versa. Such materials can be used as sensors (mechanical input, electrical output), as actuators (electrical input, mechanical output) or as vibration control devices (active where power is supplied to the system and passive where the energy generated is dissipated by an electrical component). The piezoelectric material may be in plate form (piezoceramic such as PZT 5A or PZT 5H), in fiber form, or as a single crystal. The molecular structure of the piezoelectric material is in crystal form, with the piezoelectric effect occurring along the center axis of the crystal. Poling is the operation performed to align all the piezoelectric crystals in one direction. The direction of alignment is typically referred as the poling direction in which one side of the material has a negative charge, and the opposite side has a positive charge. The maximum efficiency of energy conversion occurs along the poling direction. This is important to know so that there is a direct correlation between the voltage applied and the direction of the motion caused by the piezoelectric material. Piezoelectric materials are typically driven in a "d31" direction (through the thickness) or in a "d33" direction (along the surface of the material). Piezoelectric materials are typically driven at high voltages (+/−200V or +/−400V). The voltages can be hazardous if contacted by an individual during operation. Packaging and electrical insulation is critical for further utilization of such devices in areas where human contact may be possible.

The present invention comprises a novel way to package and manufacture a piezoelectric device. The key features of the packaging method include the encapsulation of the conductive piezoelectric material and the ease of electrical connectivity of the device to an external electrical component. The present manufacturing process employs 1) a lamination process and 2) a coating process. The lamination process is used to adhere one side of the piezoelectric device to a flexible substrate having conductive traces disposed thereon and the coating process is used on the second, opposing side of the piezoelectric device to encapsulate and protect the device. More specifically, the piezoelectric material, in fiber, powder or plate composition, is first bonded to the substrate having the conductive traces via the lamination process. The bonded device is then coated on the exposed side by insulating material that is applied by a spray-paint or powder coating operation. When multiple layers of piezoelectric material are used, copper-clad flexible conductive material is used in a middle layer (between the two pieces of piezoceramic material) and both external sides of the device are coated.

The advantages of the present invention over prior art piezoelectric packaging techniques is the ability to obtain very good energy transfer through the thin copper-clad conductive material, and to provide very good insulation and impact resistance to the outside environment through the coating process. Additionally, the manufacturing process used is straight forward and allows for high volume and low cost manufacture of piezoelectric devices. The use of flex circuitry material makes the electrical connections to the piezoelectric devices very reliable and easy to use.

BRIEF SUMMARY OF THE INVENTION

Briefly stated, the present invention, in one embodiment, is a piezoelectric device comprising a supporting substrate having a first conductive trace on a first surface and a second conductive trace on the first surface and spaced from the first conductive trace. A piezoelectric material layer has first and second surfaces, the first surface of the piezoelectric material layer being secured to the first surface of the supporting substrate and electrically connected to the first conductive trace. The second surface of the piezoelectric material layer is electrically connected to the second conductive trace. A protective coating extends over at least the second surface of the piezoelectric material layer so that at least a portion of the first and second conductive traces are exposed.

The invention further comprises a method of making a piezoelectric device comprising the steps of: providing a supporting substrate having a first conductive trace on a first surface and a second conductive trace on the first surface and spaced apart from the first conductive trace; securing a first surface of a piezoelectric material layer to the first surface of the supporting substrate so that the first surface of the piezoelectric material layer is electrically connected to the first conductive trace; electrically connecting a second surface of the piezoelectric material layer to the second conductive trace; and applying a protective coating over at least the second surface of the piezoelectric material layer so that at least a portion of the first and second conductive traces are exposed.

BRIEF DESCRIPTION OF THE SEVERAL VIEWS OF THE DRAWINGS

The foregoing summary, as well as the following detail description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentality shown.

In the drawings.

DETAILED DESCRIPTION OF THE INVENTION

Piezoelectric materials, especially piezoceramics, are quite fragile. The electrical connection to such materials is typically done by soldering directly to the electroded ceramic. This method, which requires hand labor, is costly, and is not very reliable because the soldering process may cause the ceramic to crack and break. A prior art lamination process requires several layers of materials and its packaging adds to the weight of the piezoelectric device and limits its performance due to the extra layers and increased rigidity in the packaging. The present invention uses a combination of flex circuitry and lamination processes, along with coatings and spray painting processes to achieve a reliable and effective package for a piezoceramic component.

Figure 1:
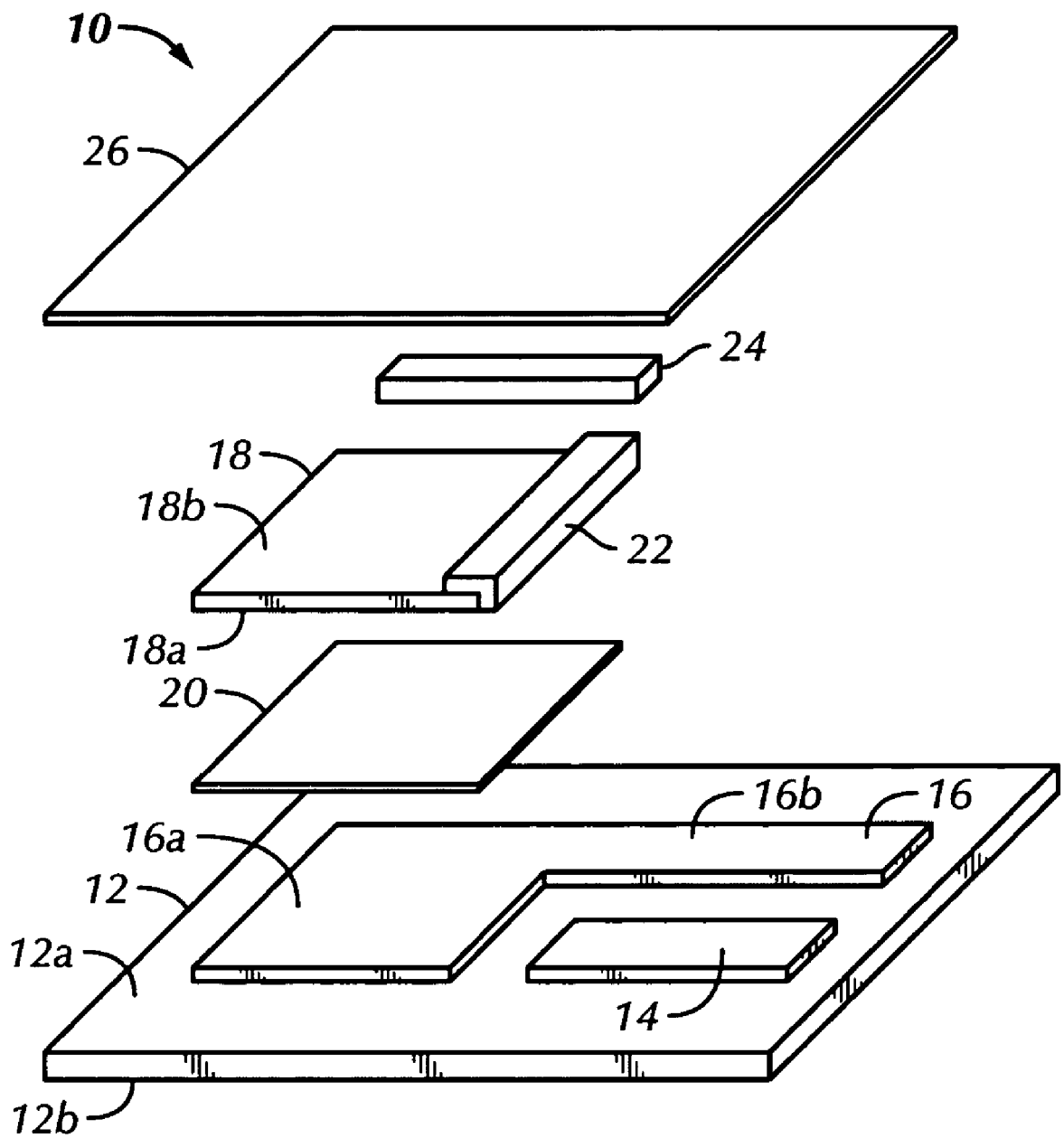
FIG. 1 is an exploded perspective diagram of a piezoelectric device in accordance with a first preferred embodiment of the present invention.

Referring to the drawings in which the same reference numerals are used to indicate the same component throughout the several figures, FIG. 1 is an exploded diagrammatic view of the components that make up a piezoelectric device 10 in accordance with a preferred embodiment of the present invention. The piezoelectric device 10 is comprised of a supporting substrate 12, a piezoelectric material layer 18 and a protective coating 26. The supporting substrate 12 is preferably formed of a flexible insulative material such as polyester, polyamide or other suitable insulating materials. In the present embodiment, the supporting substrate 12 is formed of a material known as Kapton™. However, it will appreciated by those of ordinary skill in the art that any other suitable flexible insulating material may alternatively be employed for forming the supporting substrate 12. The supporting substrate 12 includes a first surface 12a and a second surface 12b.

A first conductive trace 14 is disposed on the first surface 12a of the supporting substrate 12. As shown in FIG. 1, the first conductive trace 14 is generally rectangularly shaped. A second conductive trace 16 is also disposed on the first surface 12a of the supporting substrate 12. A shown in FIG. 1, the second conductive trace 16 includes a generally square area 16a and a generally rectangular area 16b. The rectangular area 16b of the second conductive trace 16 extends generally parallel to and is spaced apart from the first conductive trace 14. As will become apparent hereinafter, the distal ends of the conductive traces 14, 16 are used for making an electrical connection between the piezoelectric device 10 and other electrical components (not shown). In the present embodiment, both the first and second conductive traces 14, 16 are formed of copper. However, as will be apparent to those skilled in the art, either or both of the conductive traces 14, 16 could be formed of any other suitable metallic or other electrically conductive material. For example, a conductive epoxy paste or film may be used to form either or both of the conductive traces 14, 16. Further, the conductive traces 14, 16 may be etched from a copper-clad material, or a bonding process may be employed for securing the conductive traces 14, 16 to the supporting substrate 12. Further, the actual size and shape of the first and second conductive traces 14, 16, may vary from that shown in FIG. 1 if desired.

As shown in FIG. 1, the piezoelectric material layer 18 is comprised of a first or lower surface 18a and a second or upper surface 18b. As is understood by those of ordinary skill in the art, both surfaces 18a and 18b must be electrically connected to another electrical component for operation of the piezoelectric device 10. In the present embodiment, the first surface 18a of the piezoelectric material layer 18 is electrically connected to the rectangular area 16b of the second conductive trace 16 and the second surface 18b of the piezoelectric material layer 18 is electrically connected to the first conductive trace 14. In the present embodiment, mechanical and electrical connection between the first surface 18a of the piezoelectric material layer 18 and the first surface 12a of the supporting substrate 12 is made using a conductive bonding film 20 as shown in FIG. 1. In the present embodiment, the conductive bonding film 20 is an epoxy film such as a B-stage or C-stage epoxy film that can be cured at temperatures below 350° Fahrenheit. Temperatures above 350° Fahrenheit may cause damage to the polarization field of the piezoelectric material layer 18, diminishing the effectiveness of the electro-mechanical coupling. Preferably, the piezoelectric material layer 18 is secured to the supporting substrate 12 utilizing a lamination process in which pressure is applied to the second surface 18b of the piezoelectric material layer 18 and to the second surface 12b of the supporting substrate 12 so that the conductive bonding film 20 flows and creates a good bond between the piezoelectric material layer 18, the square area 16a of the second conductive trace 16 and the first surface 12a of the supporting substrate 12. The amount of pressure applied depends upon the thickness of the piezoelectric material layer 18. The thinner the piezoelectric material layer 18, the lighter the pressure that is applied. By controlling the amount of pressure applied, breakage of the fragile piezoceramic material used to form the piezoelectric material layer 18 can be minimized. Typical pressures which are used are in the range of about 5 PSI to about 1000 PSI. It will be appreciated by those skilled in the art that by using a conductive bonding film 20, a good electrical connection is made between the first surface 18a of the piezoelectric material layer 18 and the square area 16a of the second conductive trace 16. It will be appreciated by those of ordinary skill in the art that other materials or techniques may be employed for laminating or otherwise securing the piezoelectric material layer 18 to the supporting substrate 12 and to make the requisite electrical connection between the first surface 18a of the piezoelectric material layer 18 and the second conductive trace 16.

Once the piezoelectric material layer 18 has been securely bonded to the supporting substrate 12 at least the edge of the piezoelectric material layer 18 facing the first conductive trace 14 and the rectangular area 16b of the second conductive trace 16 is covered with insulation 22. In the present embodiment the insulation 22 is a coating such as Eccobond or some other insulating epoxy material. Other insulating materials may be used. The insulation 22 prevents the second surface 18b of the piezoelectric material layer 18 from contacting the second conductive trace 16 and prevents the first surface 18a of the piezoelectric material layer from contacting the first conductive trace 14 to avoid a short circuit condition.

As shown in FIG. 1, a conductive strip 24 is used for making an electrical connection between the second surface 18b of the piezoelectric material layer 18 and the first conductive trace 14. The conductive strip 24 may be formed of a strip of conductive paint, a strip of a coated conductive epoxy or any other suitable conductive material. The conductive paint or conductive epoxy may be hand brushed or screened in placed depending upon the need for accuracy and manufacturing quality requirements. Typically the conductive strip 24 is applied at room temperature.

Once the piezoelectric material layer 18 has been secured to the supporting substrate 12 with both surfaces 18a and 18b electrically connected to the respective conductive traces 14, 16 a protective coating 26 is applied over at least the second surface 18b of the piezoelectric material layer 18. The protective coating 26 may be applied by spray painting with an electrically insulating paint or using a powder coating process or in any other manner known to those of ordinary skill in the art. A powder coating process provides for better control over the insulating properties of the material. For example, a powder coating of approximately 0.002 inch can provide as much as 2000 V insulation resistance. The power coating may be selected to accommodate different environmental conditions of concern. For example, if the piezoelectric device 10 is to be used in a high moisture environment, a highly moisture resistant coating may be employed. Polyester-based coatings allow for a flexible and protective construction. A packaging of this type not only provides the durability and connectivity that is lacking in unpackaged piezoelectric devices but also does not significantly diminish the actuation performance due to the flexibility of the packaging. Tests performed demonstrate a very minimal degradation in actuation performance utilizing such a protective coating 26.

If a spray painting operation is used for applying the protective coating 26, multiple coats may be required to achieve the desired electrical insulation resistance. Typical spray paints that may be employed include Krylon 1302 which has a dielectric strength of 1,350 Volts per mil. or a Sprayon SB-6-665 red epoxy insulating enamel which has a dielectric strength of 1,100 Volts per mil.

If impact resistance of the piezoelectric device 10 is of concern, the protective coating 26 may include multiple layers of different coating materials that may include rubber based tapes or epoxies or the like. Such materials will produce a thicker coating but will also provide added protection if the piezoelectric device is exposed to impact and/or harsh environmental agents. It will be appreciated by those of ordinary skill in the art that the protective coating 26 could be formed of other materials and could be applied in some other manner.

Figure 2:
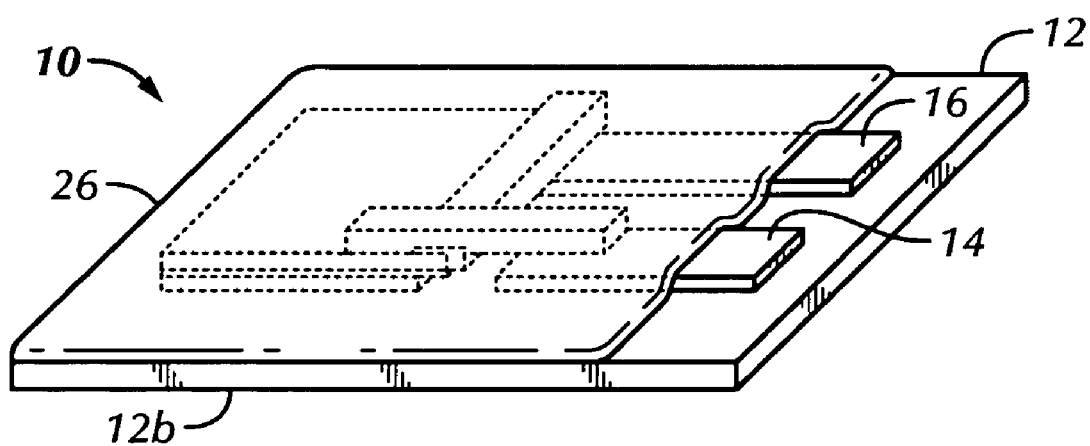
FIG. 2 is a perspective view of the piezoelectric device of FIG. 1 in an assembled condition.

As best shown in FIG. 2 the protective coating 26 while covering the piezoelectric material layer 18 does not extend over the entire surface of the supporting substrate 12. Instead, at least the distal portions of each of the conductive traces 14, 16 remain exposed so that they can be used as connection points for the piezoelectric device 10. An electrical connector (not shown) may be connected directly to the distal ends of the conductive traces 14, 16 or, conductive leads (not shown) may be soldered to the conductive traces 14, 16.

Figure 3:
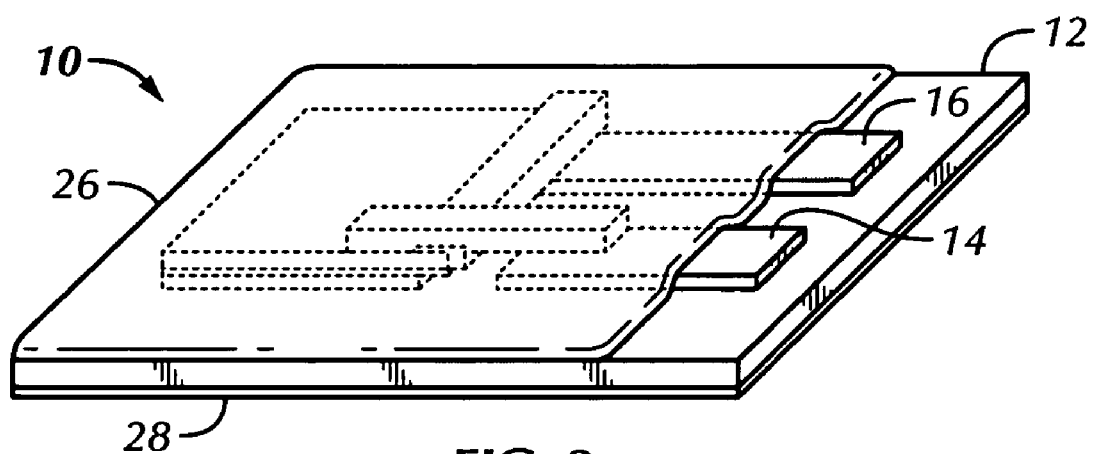
FIG. 3 is a perspective view of the piezoelectric device shown in FIG. 2 with the addition of a bonding substrate.

Once the piezoelectric electric device 10 has been completed it may be bonded to a structure individually or used in pairs as actuators. In the embodiment shown in FIG. 3, the piezoelectric device 10 includes a bonding substrate 28 which is applied to the second surface 12b of the supporting substrate 12. The bonding substrate 28 could comprise double sided tape, a heat activated epoxy or any other suitable connecting material known to those or ordinary skill in the art. The bonding substrate 28 may be secured to the piezoelectric device 10 as part of the manufacturing process or could be added at a later time, for example, when the piezoelectric device 10 is about to be applied to some other supporting structure for use.

Figure 4:
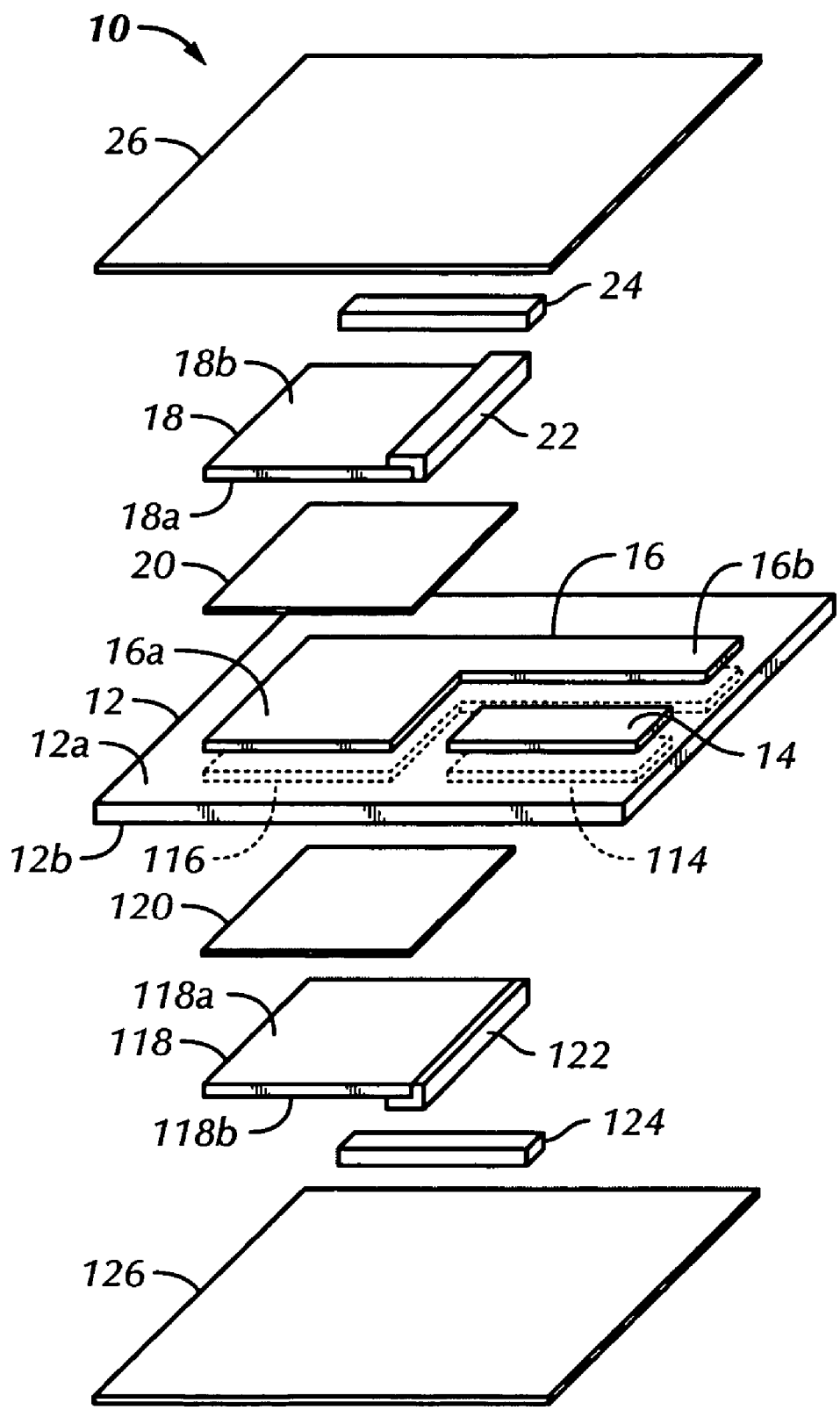
FIG. 4 is an exploded perspective diagram of an alternate embodiment of a dual piezoelectric device in accordance with the present invention.

Piezoelectric devices of the type disclosed are often used as an actuator to open or close a valve or in ways that does not require attachment to an existing structure. In such applications, there are typically at least two layers of piezoelectric materials that comprise the overall actuated device which is typically referred to as a "bender". FIG. 4 illustrates a bender formed in accordance with the present invention. The bender is essentially the same as the single layer piezoelectric device 10 described above but with the addition of a second piezoelectric device applied to the second surface 12b of the supporting substrate 12 effectively as a mirror image. For the sake of clarity, the various components of the second piezoelectric device have been given the same reference numerals as with the piezoelectric electric device 10 but with the addition of a 1 before each reference numeral. For example, the second piezoelectric material layer has been given reference numeral 118 and the third and fourth conductive traces have been given reference numerals 114 and 116 respectively. Connections may be made through a hole or other connection scheme known to those of ordinary skill in the art.

From the foregoing it can be seen that the present invention comprises a package for a piezoelectric device and a method of making the package. It will be appreciated by those skilled in the art that changes could be made to the embodiments described above without departing from the broad inventive concepts thereof. It is understood, therefore, that the invention is not limited to the particular embodiments disclosed, but is intended to cover all modifications within the spirit and scope of the invention as defined by the appended claims.

The invention claimed is:

1. A piezoelectric device comprising:
   a supporting substrate;
   a first conductive trace on a first surface of the supporting substrate;
   a second conductive trace on the first surface of the supporting substrate and spaced from the first conductive trace;
   a third conductive trace on a second surface of the supporting substrate;
   a fourth conductive trace on the second surface of the supporting substrate and spaced from the third conductive trace;
   a first piezoelectric material layer having first and second surfaces, the first surface of the first piezoelectric material layer being secured to the first surface of the supporting substrate and electrically connected to the second conductive trace, the second surface of the first piezoelectric material layer being electrically connected to the first conductive trace;
   a second piezoelectric material layer having first and second surfaces, the first surface of the second piezoelectric material layer being secured to the second surface of the supporting substrate and electrically connected to the fourth conductive trace, the second surface of the second piezoelectric material layer being electrically connected to the third conductive trace;
   a first protective coating extending over at least the second surface of the first piezoelectric material layer so that at least a portion of the first and second conductive traces are exposed; and
   a second protective coating extending over at least the second surface of the second piezoelectric electric material layer so that at least a portion of the third and fourth conductive traces are exposed.

2. The piezoelectric device as recited in claim 1 wherein the supporting substrate is formed of a flexible insulating material.

3. The piezoelectric device as recited in claim 2 wherein the flexible insulating material is a polyester material.

4. The piezoelectric device as recited in claim 2 wherein the flexible insulating material is a polyamide material.

5. The piezoelectric device as recited in claim 1 wherein the first, second, third, and fourth conductive traces are formed of one of a metallic conductive material and a conductive epoxy material.

6. The piezoelectric device as recited in claim 1 wherein the first surfaces of the first and second piezoelectric material layers are secured to the supporting substrate by a conductive bonding film.

7. The piezoelectric device as recited in claim 6 wherein the conductive bonding film is an epoxy film.

8. The piezoelectric device as recited in claim 1 wherein the second surface of the first piezoelectric material layer is connected to the first conductive trace by a first conductive strip; and the second surface of the second piezoelectric material layer is connected to the third conductive trace by a second conductive strip.

9. The piezoelectric device as recited in claim 8 wherein the first and second conductive strips consists of one of a conductive paint and a coated conductive epoxy.

10. The piezoelectric device as recited in claim 1 wherein the first and second protective coatings are comprised of a spray painted layer.

11. The piezoelectric device as recited in claim 1 wherein the first and second protective coatings are comprised of a powder coating.

12. A method to manufacture a piezoelectric device comprising the steps of:

providing a supporting substrate having a first conductive trace on a first surface of the supporting substrate, a second conductive trace on the first surface and spaced from the first conductive trace, a third conductive trace on a second surface of the supporting substrate, and a fourth conductive trace on the second surface and spaced from the third conductive trace;

securing a first surface of a first piezoelectric material layer to the first surface of the supporting substrate so that the first surface of the first piezoelectric material layer is electrically connected to the second conductive trace, and securing a first surface of a second piezoelectric material layer to the second surface of the supporting substrate so that the first surface of the second piezoelectric material layer is electrically connected to the fourth conductive trace;

electrically connecting a second surface of the first piezoelectric material layer to the first conductive trace, and electrically connecting a second surface of the second piezoelectric material layer to the third conducive trace; and applying a first protective coating over at least the second surface of the first piezoelectric material layer so that at least a portion of the first and second conductive traces are exposed, and applying a second protective coating over at least the second surface of the second piezoelectric material layer so that at least a portion of the third and fourth conductive traces are exposed.

* * * * *

UNITED STATES PATENT AND TRADEMARK OFFICE
CERTIFICATE OF CORRECTION

PATENT NO. : 7,105,988 B2 Page 1 of 1
APPLICATION NO. : 10/834683
DATED : September 12, 2006
INVENTOR(S) : Emanuele Bianchini It is certified that error appears in the above-identified patent and that said Letters Patent is hereby corrected as shown below:

<u>Title Page, Section (73)</u>:

The assignee should read: -- VIBRATION-X di Bianchini Emanuele e C. Sas --.

Signed and Sealed this

Thirteenth Day of February, 2007

JON W. DUDAS
*Director of the United States Patent and Trademark Office*